United States Patent [19]

Young et al.

[11] Patent Number: 4,710,395
[45] Date of Patent: Dec. 1, 1987

[54] METHOD AND APPARATUS FOR THROUGH HOLE SUBSTRATE PRINTING

[75] Inventors: William M. Young; Mark E. Wolfe, both of Kokomo, Ind.

[73] Assignee: Delco Electronics Corporation, Kokomo, Ind.

[21] Appl. No.: 863,145

[22] Filed: May 14, 1986

[51] Int. Cl.$^4$ ............................................... H05K 3/12
[52] U.S. Cl. ......................................... 427/8; 427/97; 427/294
[58] Field of Search ............... 427/8, 97, 294; 118/50, 118/697

[56] References Cited

U.S. PATENT DOCUMENTS

| | | | |
|---|---|---|---|
| 3,357,856 | 12/1967 | Ragan | 118/50 |
| 3,604,391 | 9/1971 | Mallia | 118/50 |
| 4,278,706 | 7/1981 | Barry | 427/96 |
| 4,478,882 | 10/1984 | Roberto | 118/50 |
| 4,554,732 | 11/1985 | Sadlo | 427/96 |

FOREIGN PATENT DOCUMENTS

| | | | |
|---|---|---|---|
| 60-167396 | 8/1985 | Japan | 427/97 |
| 2143473 | 2/1985 | United Kingdom | 427/97 |

Primary Examiner—John D. Smith
Attorney, Agent, or Firm—Robert J. Wallace

[57] ABSTRACT

A method and apparatus for printing through holes in ceramic substrates and the like. The substrate is held in position by means of a vacuum applied to an outer peripheral surface portion thereof. The deposited substance is pulled through the holes in the substrate by means of a closely regulated vacuum applied only to an inner surface portion, the inner and outer vacuum areas being separated in a holder device by means of O-rings. A pressure-time profile which appears in a plenum closely adjacent to the inner chamber may be compared to a previously generated pressure-time profile reference and used to accept or reject parts.

2 Claims, 3 Drawing Figures

METHOD AND APPARATUS FOR THROUGH HOLE SUBSTRATE PRINTING

FIELD OF THE INVENTION

This invention relates to the manufacture of substrate-mounted electrical circuit and particularly to the printing of conductive materials on the inner surfaces of through holes in the substrate using vacuum techniques.

BACKGROUND OF THE INVENTION

Insulative substrates for electrical circuit devices typically include through holes which are "printed" through with conductive material to make an electrical connection from one side of the substrate to the other. The prior art technique for accomplishing of the through holes involves the use of a vacuum fixture which creates sufficient vacuum to hold the substrate in place while, at the same time, pulling air through the holes in the substrate as a conductive fluid is spread across the top surface of the substrate with the use of a squeegee.

The results of the through hole printing process briefly described immediately above have thus far been characterized by extreme non-uniformity due, in large part, to the inherent variations in the squeegee deposition process from one side of the substrate to the other, the variation in vacuum pressure during the deposition process as well as a similar variation from one substrate to the other and in the relative lack of sophistication in the deposition equipment; i.e., the equipment is technically oriented toward achieving the printing function and provides virtually no information on the relative qualities of the finished product from one to the other.

SUMMARY OF THE INVENTION

In accordance with the first aspect of the invention, an improved apparatus for achieving through hole printing of substrate devices is provided, which apparatus is capable of providing highly uniform product quality by identifying substrates and/or process parameters which do not conform to preestablished standards. In general, the apparatus comprises a device for receiving the substrate to be printed, providing a vacuum source of precisely known parameters, means for generating a vacuum pressure-time curve during the application of the precisely known vacuum to the substrate and means for comparing the resulting curve to a preestablished reference thereby to monitor production quality.

In accordance with a second aspect of the invention, an apparatus is provided for holding substrates in place during a through hole printing process and providing a precisely known and regulable vacuum during the through hole printing process. In general, this apparatus comprises a holder device which receives and holds a substrate having one more through holes formed therein, seal means in the holder means for defining, while bearing against said substrate, an outer vacuum chamber and an inner vacuum chamber which is wholly within the outer chamber, the holes in the substrate lying within the effective area of the inner chamber, means for evacuating the outer chamber to hold the substrate in place, and independent means for evacuating the inner chamber to pull printing fluid through the substrate holes to line the interior surfaces thereof.

In accordance with a third aspect of the invention, a method of printing through holes in electrical substrate devices is provided which method has been found to substantially enhance the uniformity and quality of the finished product.

In general, the method comprises the steps of placing the substrate in a holder which defines an outer vacuum chamber and an inner vacuum chamber which is wholly within the outer chamber, drawing a vacuum in the outer chamber to secure the substrate to the holder, depositing a printing fluid over the portion of the substrate having holes to be printed and thereafter drawing a vacuum in said inner chamber to pull the printing fluid into and through the holes.

The method is preferably carried out through the use of an apparatus having the capability of monitoring pressure in a plenum beneath the substrate thereby to generate a pressure-time curve which can be compared to a reference pressure-time curve to evaluate and monitor end product quality.

DETAILED DESCRIPTION OF THE ILLUSTRATIVE EMBODIMENT

Figure 1:
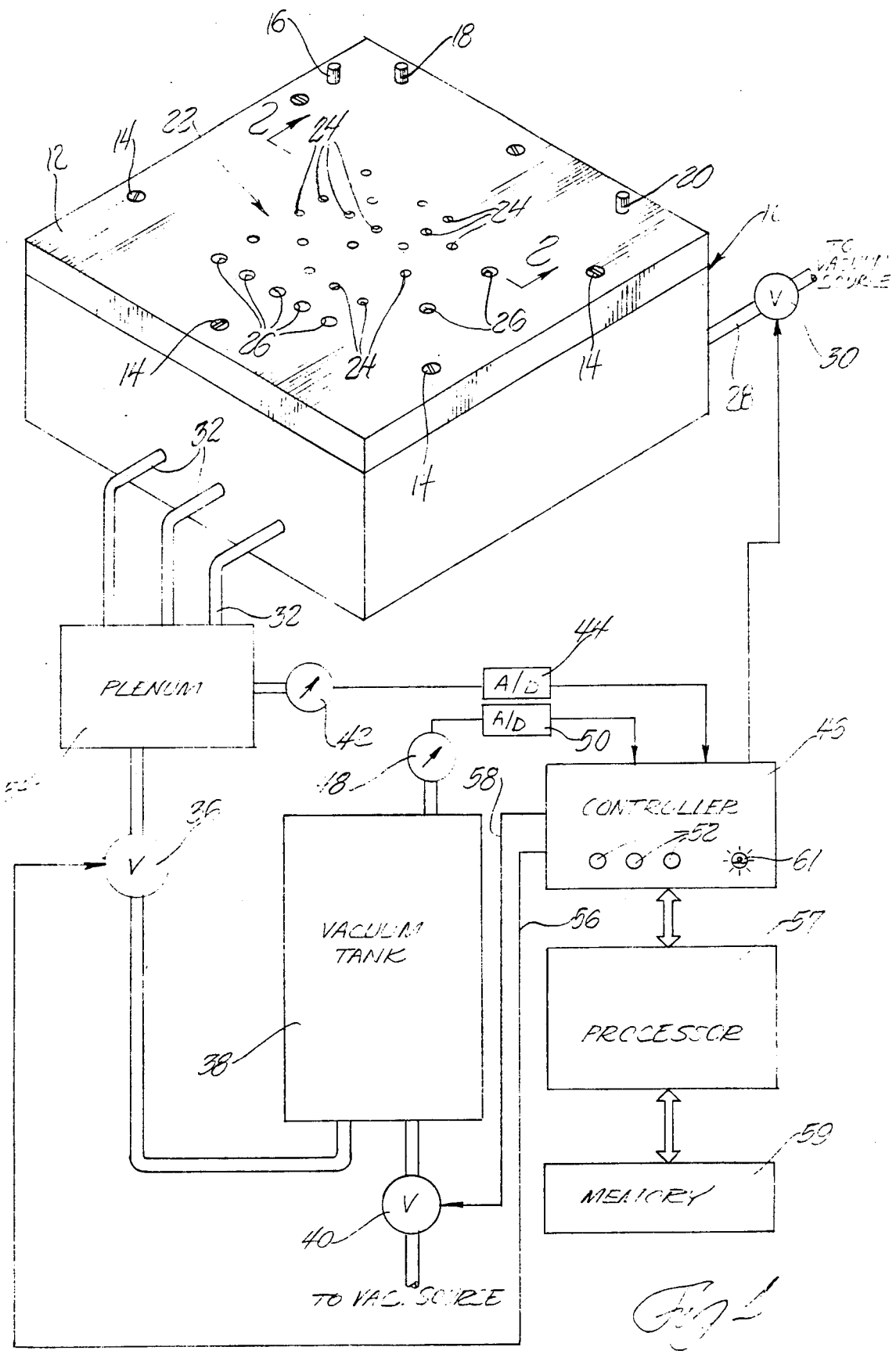
FIG. 1 is a schematic diagram of an apparatus for printing through holes in substrates and embodying the invention.

FIG. 1 shows an illustrative embodiment of the invention adapted to print through holes in flat ceramic substrates and to monitor the physical characteristics of the substrate and the printing process as a function of air pressure in a plenum proximate the substrate and to compare these indicated physical characteristics with devices and process characteristics previously determined to be satisfactory.

Specifically, the apparatus comprises a holder 10 which may be the work head of a console. The holder 10 comprises a steel tooling plate 12 bolted to the top surface thereof by means of recessed cap screws 14 and having a system of pins 16, 18 and 20 for precisely locating a flat rectangular ceramic substrate over a perforated vacuum area 22 having a predetermined pattern of holes 24 which, when the device is operated in combination with the substrate, are in register with holes in the substrate to be printed through. Plate 12 also has a plurality of vacuum hold-down ports 26 which hold a solid ceramic substrate to the surface thereof during a print operation as hereafter described.

Figure 2:
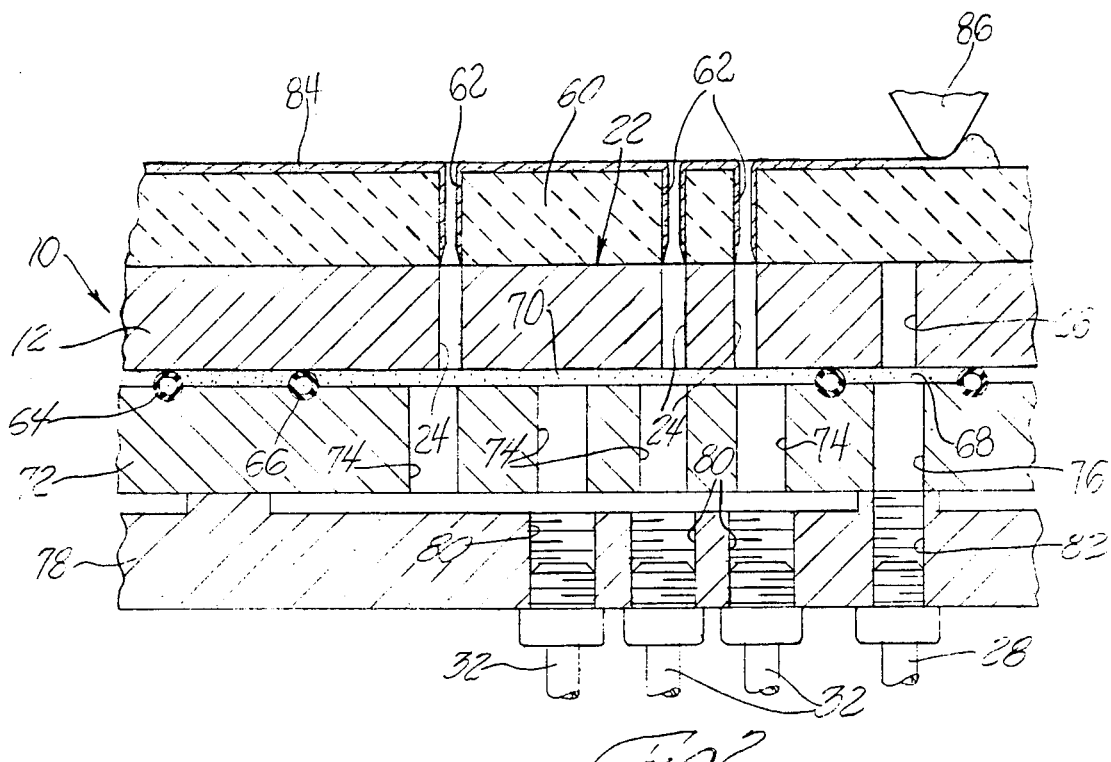
FIG. 2 is a sectional view of a portion of the apparatus of FIG. 1.

Vacuum ports 26 are connected through holder 10 in a manner hereinafter described to an external supply line 28 having a shut-off valve 30 therein. Holes 24 are connected through holder 10 in a manner hereinafter described to external lines 32 which connect to a common plenum 34. Vacuum lines 32 pass through the side wall of holder 10, and make a right angle bend up to the bottom wall of the holder 10. Their connection to this wall is shown in FIG. 2. The plenum 34 is connected through shut-off valve 36 to a vacuum tank 38 of precisely known size and volume. Tank 38 is connected to an external vacuum source through shut-off valve 40.

Plenum 34 is provided with an electric pressure gage 42 which provides an analog signal voltage linearly representing pressure in the plenum. This signal voltage is connected through analog-to-digital converter 44 to an input of controller 46. Tank 38 has a similar electric pressure gage 48 connected through analog-to-digital converter 50 to another input of controller 46. Knobs, pedals and/or switches 52 are provided on controller 46 for purposes to be described.

Controller 46 has output lines 56 and 58 connected to valves 36 and 40, respectively, for controlling the conditions of the valves at various times in a printing process.

Controller 46 is connected to a digital processor 57 having a program memory 59 to complete the system.

Briefly, the function of the apparatus thus far described is as follows. A flat ceramic substrate having holes to be printed through is placed on tooling plate 12 of the holder 10 and precisely located over the vacuum area 22 by means of locator pins 16, 18 and 20 so the holes to be printed through line up with hole 24. Valve 30 is opened via controller 46 to admit vacuum to ports 26 to effectively "clamp" the substrate in place. The exposed surface of the substrate is printed using conventional printing apparatus. This step leaves a web or membrane of the printing substance over the holes to be printed through.

The substrate is removed from the printing area. Meanwhile tank 38 is charged with valve 40 open and valve 36 closed. Then, the valve 40 is closed and valve 36 is opened to pull a vacuum through the lines 32 and the holes 24. The evacuation of the volume of the substrate within the through holes causes the membranes of printed substance to be pulled rapidly down through the holes, coating the walls of the holes as it moves. Gage 42 provides a set of signals to controller 46 for processor 57 which establish a pressure-time profile or pressure values in plenum 34 as the through hole printing step takes place. These values are compared to pre-established values in memory to determine the acceptability of the finished product. If it is not acceptable, an alarm light 61 is actuated.

Referring now to FIG. 2, the internal details of holder 10 will be described. The figure illustrates a substrate 60 having pre-formed through holes 62 lying on the tooling plate 12. Holes 24 are arrayed in tooling plate 12 in a pattern identical to the array of holes in a ceramic substrate that is to be placed on tooling plate 12. The tooling plate 12 rests on an outer O-ring 64 and an inner O-ring 66 which together define a first, outer, vacuum chamber 68 and a second, inner vacuum chamber 70 which is within the outer chamber. The outer chamber 68 communicates with hold-down vacuum ports 26. The inner vacuum chamber 70 communicates with vacuum area 22 through the holes 24. Holes 62 in substrate 60 register with holes 24 in tooling plate 12. No holes in substrate 60 register with the hold down holes 26 in tooling plate 12.

The O-rings 64 and 66 rest on or may alternatively be sealingly attached to a first baffle plate 72 within holder 10. Plate 72 contains a number of ports 74 which, although fewer in number than holes 24, are larger in diameter. Plate 72 also contains port 76 which communicates with the outer chamber 68.

Baffle plate 72 is effectively spaced from a second baffle plate 78 having ports 80 which are fewer in number but larger in diameter and flow capacity than ports 74 of plate 72. In addition, plate 78 has a large port 82 which communicates with port 76 in plate 72.

The outer vacuum chamber 68 is connected through ports 76 and 82 to the vacuum line 28 having the valve 30 therein so that ports 26 may be connected to an external vacuum source (not shown) to provide sufficient vacuum in the outer chamber to hold the substrate 60 in place during the through hole printing process. Valve 30 is preferably solenoid-controlled and is connected to the controller 46 as previously described so that an operator may open and close the valve 30 to apply and release holding pressure as desired. Two or more such hold-down ports may be provided if desired.

The inner chamber 70 is connected through ports 74 and 80 to multiple vacuum lines 32 which run externally of holder 10 to the plenum 34 which, as previously described, provides a small chamber within which the vacuum may be closely monitored during a through hole printing process. The plenum is connected through a vacuum conduit including valve 36 to the vacuum tank 38 of precisely known volume so that the proper manipulation of the valve 36 by means of the controller 46 permits vacuum of precisely known volumetric and subatmospheric value levels to be applied to the plenum 34 and thence to the holes 62 of the substrate 60.

The pressure in plenum 34 is monitored by means of a highly accurate pressure transducer gage 42 preferably taking the form of a strain gage transducer which is capable of providing a relatively wide voltage swing over the vacuum range of interest; i.e., from about 0.20 atmospheres to about 1.02 atmospheres. The gage 42 is connected through an analog-to-digital converter 44 to an input of the controller 46 as described above.

Controller 46 is connected in a bi-directional input-output mode to digital processor 57 which in turn is connected to memory 59, which is a conventional digital storage device such as a hard disk. The function of the processor 57 is to receive through the controller 46 the pressure inputs from the gages 42 and 48 and, particularly from gage 42, to generate a pressure-time curve during the through hole printing process of a substrate 60 in place on the tooling plate 12 of holder 10. Processor 57 then retrieves from memory 59 a pressure-time profile or data representing a satisfactory through hole printed substrate of the same physical characteristics of the substrate undergoing the through hole printing process. Based on the results of the comparison, the processor 57 is programmed to indicate out-of-tolerance substrates or other noncomplying conditions indicating that the substrate under process will not conform to accepted production standards. The particular software and processing steps necessary to carry out these functions are straightforward and will be apparent to those skilled in the digital processor programming arts on the basis of the disclosure given herein.

Referring again to FIG. 2, a representative ceramic substrate 60 is shown disposed atop the tooling plate 12 and properly located so that the holes 62 in the substrate 60 which are to be printed are in register with the holes 24 in the tooling plate 12.

When substrate 60 is in place and has received a layer 84 of substance to be printed, for example a copper-based conductor, the valve 36 is opened and valve 40 closed. The holes 62 in the substrate 60 are then exposed to the precisely regulated vacuum in the tank 38 to pull air through the holes 62, and the lines 32 to the plenum 34.

Describing now the use of the apparatus shown in FIGS. 1 and 2, the first step is to place the substrate 60 on the tooling plate 12 which matches that particular substrate. It will be appreciated by those skilled in the art that two tooling plates typically exist for each substrate pattern, one tooling plate to correspond to the printing pattern on the top surface of the substrate and the other corresponding to the printing pattern on the bottom surface of the substrate. The vacuum tank 38 is pump-evacuated to the appropriate vacuum level as indicated by gage 48; valve 40 is opened and valve 36 is closed during this step. The controller 46 may be provided with a suitable interlock so that no further process steps may be actuated until the appropriate pressure is indicated by the input of gages 42 and 48 to the controller 46. Controller 46 is actuated to open valve 30 to secure the substrate in place by the evacuation of the relatively small chamber 68 between the inner and outer O-ring seals.

The next step is to apply substance 84 to the surface of the substrate 60 by means of an automated, semi-automated or even manually operated squeegee 86. Automated application apparatus is preferred for purposes of the present invention and such apparatus is well-known and will not be described in detail in this document. Such apparatus may include means for sliding the holder 10 under a screen having a desired conductor pattern formed as an opening therein, spreading conductor paste 84 on the screen, and drawing the squeegee 86 across the top of the screen to form deposit on the substrate 60. The paste substance 84 extends over the area of the substrate surface corresponding with the through holes 62 which are to be printed through, thereby to ultimately exhibit full surface linings of conductive material.

Figure 3:
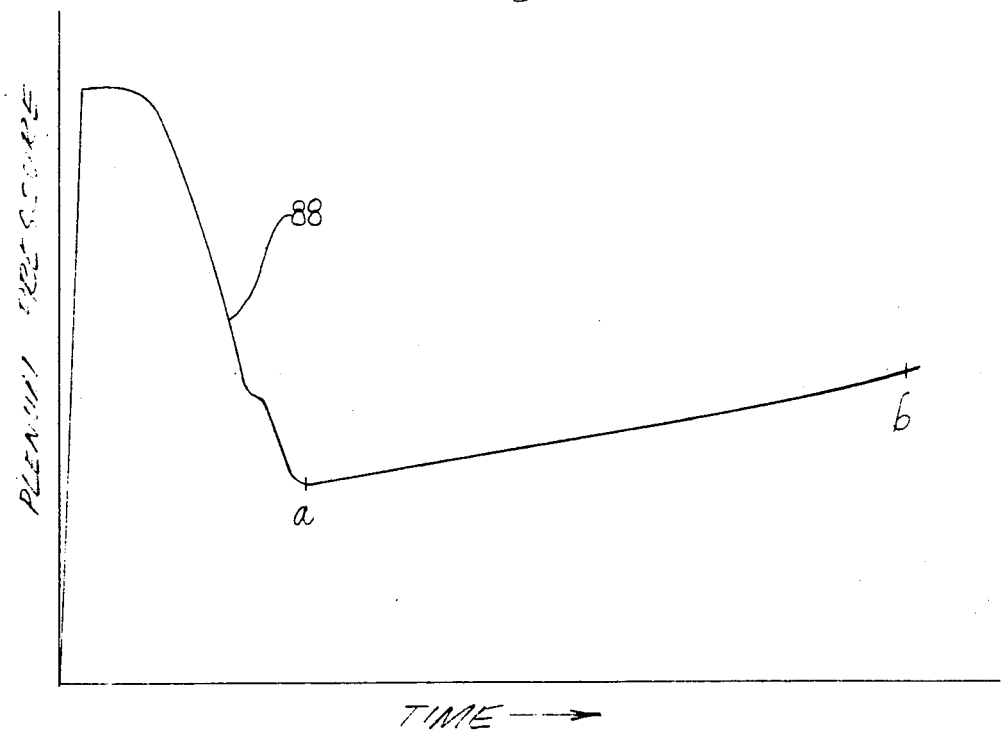
FIG. 3 is a representation of a typical pressure-time curve which is generated in the course of utilizing the apparatus of FIGS. 1 and 2.

After the deposit of the paste 84 has been accomplished, and the combination of the controller 46 and the processor 57 indicates that the proper pressure level has been obtained in the tank 38, valve 40 is closed and the valve 36 is opened to apply the precisely known vacuum to the plenum 34 and thence to the substrate 60. The resulting pressure-time profile 88 shown in FIG. 3 is produced by sampling the output of the gage 42 at closely spaced time intervals as the known vacuum pulls the paste 84 through the holes 62. Processor 57 digitizes the data taken by sampling the profile 88 between points a and b and compares this data to data previously stored in memory 59 taken during the production of a satisfactory substrate product; i.e., this data may be a set standard or a running average of readings. If the data compares favorably, the substrate 60 under process is accepted. If the data does not compare, it may be analyzed to determine the reason for the lack of coincidence and in any event the substrate 60 may be rejected. For example, it will be understood that the substrate having holes 62 which are over-large may result in too rapid a pressure rise and too high an ultimate pressure level. On the other hand, a substrate having holes 62 which are unacceptably small in diameter may result in too slow a pressure rise and too low a minimum value. Other comparisons will be apparent to those skilled in the art.

By way of example, a substrate having 0.010 inch to 0.016 inch diameter holes used in connection with a pressure transducer 42 which is calibrated across a range of 4600 mv. with 35 sample times over a 350 millesec print cycle produces a pressure time profile 88 approximately as shown in FIG. 3. Processor 57 must obviously be chosen to accommodate the sampling rate and the processing requirements of the particular test.

The embodiments of the invention in which an exclusive property or privilege is claimed are defined as follows:

1. A method not only of controllably forming coatings of a printing substance on through holes in insulative substrates but also of concurrently determining variations in quality of the coated substrate, comprising the steps of:

placing a face of an insulative substrate having through-holes therein on a holder while leaving the opposite face of the substrate exposed to atmospheric air, said holder having a first vacuum area, that does not register with said through-holes and is used for hold-down of said insulative substrate on said holder, and a second vacuum area, for registration with said through-holes;

drawing a vacuum in said first vacuum area to secure said insulative substrate to said holder;

depositing a printing substrate over portions of the insulative substrate having said through-holes;

producing a predetermined vacuum in a plenum of predetermined volume for exposure to the second vacuum area;

terminating evacuation of said plenum after establishing said predetermined plenum vacuum;

without resuming said plenum evacuation, exposing said second area to said predetermined plenum vacuum, effective to cause said printing substance to be pulled into said through-holes in a highly controlled manner, and thereby produce a highly controlled coating on substrate walls forming said through holes;

measuring pressure in said plenum at one or more preselected times during a period immediately following exposure of the second vacuum area to the predetermined plenum vacuum; and comparing each such measured plenum pressure to a reference pressure, whereby potentially unsatisfactory coated insulative substrates are identified.

2. A method not only of controllably printing coatings on walls forming through-holes in a ceramic substrate for an electrical circuit but also of concurrently determining variations in quality of the coated substrate, comprising the steps of:

placing a flat ceramic substrate for an electrical circuit on a holder which defines a vacuum hold-down area adjacent one or more edges of the substrate, and further defines a second vacuum area spaced inwardly on said substrate from said edges and registering with through-holes in said ceramic substrate that are to receive a coating thereon;

drawing a vacuum in said vacuum hold-down area of said holder while an opposite face of said substrate is exposed to atmospheric air, to secure said substrate to said holder;

printing a paste over portions of said opposite face of said substrate having said through-holes;

producing a predetermined vacuum in a plenum of predetermined volume for exposure to the second vacuum area;

discontinuing evacuation of said plenum after establishing said predetermined plenum vacuum;

thereafter exposing said second area of said holder to said predetermined plenum vacuum, to pull said paste into and through said through-holes in a highly controlled manner, and thereby produce a coating of highly controlled thickness on substrate walls forming said through-holes;

monitoring pressure in said plenum at selected intervals during a time period immediately following exposure of the second vacuum area to the predetermined plenum vacuum, to produce a measured time-pressure profile; and comparing said measured time-pressure profile to a reference time-pressure profile, to identify substrates producing unacceptable deviations in said predetermined plenum vacuum from said reference time-pressure profile during said period immediately following exposure of said second vacuum area to said predetermined plenum volume.

* * * * *